United States Patent
Mitsugi et al.

(10) Patent No.: US 8,859,307 B2
(45) Date of Patent: Oct. 14, 2014

(54) SEMICONDUCTOR DEVICE AND METHOD FOR MANUFACTURING SAME

(75) Inventors: Satoshi Mitsugi, Kanagawa-ken (JP); Toshiyuki Oka, Kanagawa-ken (JP); Shinya Nunoue, Chiba-ken (JP); Hiroshi Katsuno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,120

(22) Filed: Aug. 31, 2012

(65) Prior Publication Data

US 2013/0234298 A1    Sep. 12, 2013

(30) Foreign Application Priority Data

Dec. 13, 2011  (JP) ................. 2011-272084

(51) Int. Cl.
| | |
|---|---|
| H01L 21/00 | (2006.01) |
| B23K 26/00 | (2014.01) |
| B23K 26/20 | (2014.01) |
| B23K 26/18 | (2006.01) |
| H01L 23/34 | (2006.01) |
| H01L 23/00 | (2006.01) |

(52) U.S. Cl.
CPC .............. *H01L 23/34* (2013.01); *B23K 26/009* (2013.01); *B23K 26/20* (2013.01); *B23K 26/18* (2013.01); *H01L 2224/83* (2013.01); *B23K 26/0042* (2013.01); *H01L 24/83* (2013.01)
USPC ........................................................ 438/29

(58) Field of Classification Search
CPC ............ H01L 21/02675; H01L 21/268; H01L 21/02686; H01L 21/263
USPC ..................... 257/629; 219/121.64; 156/272.8
See application file for complete search history.

(56) References Cited

U.S. PATENT DOCUMENTS

2006/0141202 A1* 6/2006 Suenaga ..................... 428/64.1
2010/0244077 A1* 9/2010 Yao .................................. 257/98

FOREIGN PATENT DOCUMENTS

| JP | 2002-368282 | 12/2002 |
|---|---|---|
| JP | 2003-31847 | 1/2003 |
| JP | 2006-142655 | 6/2006 |
| JP | 2010-92897 | 4/2010 |
| JP | 2011-137918 | 7/2011 |
| JP | 2012-33589 | 2/2012 |

OTHER PUBLICATIONS

Japanese Office Action issued Jun. 13, 2014, in the counterpart Japanese patent application No. 2011-272084 with English translation.
Japanese Office Action issued Aug. 27, 2014, in counterpart Japanese patent application No. 2011-272084 w/English translation.

* cited by examiner

*Primary Examiner* — Whitney T Moore
(74) *Attorney, Agent, or Firm* — Oblon, Spivak, McClelland, Maier & Neustadt, L.L.P.

(57) ABSTRACT

According to an embodiment, a method for manufacturing a semiconductor device includes a placement step and a bonding step. The placement step faces a semiconductor active portion toward a support substrate portion via a bonding portion disposed between the semiconductor active portion and the support substrate portion. The bonding portion includes a bonding layer and a light absorption layer, absorptance of the light absorption layer for laser light being higher than or equal to absorptance of the bonding layer for the laser light. The bonding step bonds the semiconductor active portion and the support substrate portion by irradiating the light absorption layer with the laser light through the support substrate portion and melting the bonding layer by thermal conduction from the light absorption layer heated by the laser light.

13 Claims, 14 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2011-272084, filed on Dec. 13, 2011; the entire contents of which are incorporated herein by reference.

FIELD

Embodiments are generally related to a semiconductor device and a method for manufacturing the same.

BACKGROUND

In manufacturing a semiconductor device, the substrate may be separated from the semiconductor layer after crystal growth of a semiconductor layer on a substrate. For instance, in manufacturing an LED (light emitting diode) based on gallium nitride (GaN), a substrate made of e.g. sapphire or silicon is used as a growth substrate, and separated from the GaN layer. Specifically, for instance, the grown semiconductor layer is bonded to a support substrate, and then the growth substrate is separated from the semiconductor layer. At this time, low melting point solder, for instance, is sandwiched at the bonding surface between the semiconductor layer and the support substrate. These are entirely heated under pressure applied thereto in order to bond the semiconductor layer and the support substrate. This heating may damage the semiconductor layer.

DETAILED DESCRIPTION

Figure 1A:
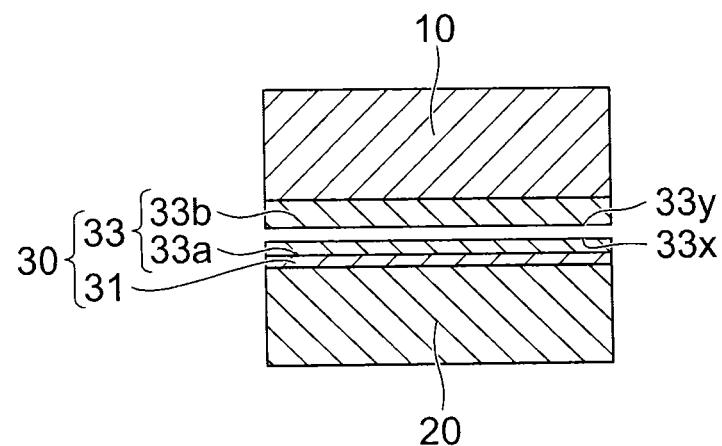
FIGS. 1A and 1B are schematic sectional views illustrating a manufacturing method of a semiconductor device according to a first embodiment.

According to an embodiment, a method for manufacturing a semiconductor device includes a placement step and a bonding step. The placement step faces a semiconductor active portion toward a support substrate portion via a bonding portion disposed between the semiconductor active portion and the support substrate portion. The bonding portion includes a bonding layer and a light absorption layer, absorptance of the light absorption layer for laser light being higher than or equal to absorptance of the bonding layer for the laser light. The bonding step bonds the semiconductor active portion and the support substrate portion by irradiating the light absorption layer with the laser light through the support substrate portion and melting the bonding layer by thermal conduction from the light absorption layer heated by the laser light.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
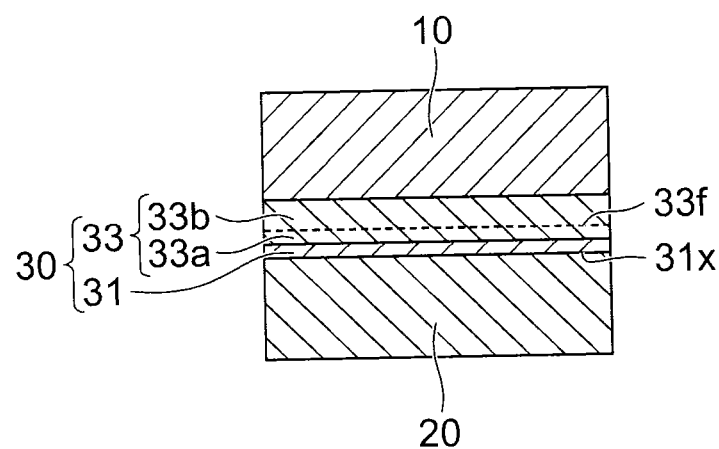

FIGS. 1A and 1B are schematic sectional views illustrating a manufacturing method of a semiconductor device according to a first embodiment.

As shown in FIG. 1A, a semiconductor active portion 10 and a support substrate portion 20 are used in the manufacturing method of the semiconductor device according to the embodiment. In this manufacturing method, the semiconductor active portion 10 and the support substrate portion 20 are opposed to each other across a bonding portion 30 (placement step).

The bonding portion 30 includes a bonding layer 33 and a light absorption layer 31. The light absorption layer 31 is provided between the bonding layer 33 and the support substrate portion 20. The absorptance of the light absorption layer 31 for laser light is higher than or equal to the absorptance of the bonding layer 33 for the laser light. For instance, the absorptance of the light absorption layer 31 is higher than the absorptance of the bonding layer 33.

In this example, the bonding layer 33 includes a first bonding film 33a and a second bonding film 33b. The first bonding film 33a is provided between the light absorption layer 31 and the semiconductor active portion 10. The second bonding film 33b is provided between the first bonding film 33a and the semiconductor active portion 10.

For instance, the second bonding film 33b is provided on the major surface of the semiconductor active portion 10. On the other hand, the light absorption layer 31 is provided on the major surface of the support substrate portion 20. The first bonding film 33a is provided on the light absorption layer 31. In the above opposing step (placement step), the semiconductor active portion 10 and the support substrate portion 20 are opposed to each other so that the first bonding film 33a and the second bonding film 33b are opposed to each other.

Thus, the bonding portion 30 includes a second bonding film 33b provided on the semiconductor active portion 10 and a light absorption layer 31 provided on the support substrate portion 20. The bonding portion 30 further includes a first bonding film 33a provided on the light absorption layer 31.

As shown in FIG. 1B, the semiconductor active portion 10 and the support substrate portion 20 are bonded to each other via the bonding portion 30.

That is, the semiconductor active portion 10 and the support substrate portion 20 are opposed to each other across the bonding portion 30. Thus, the first bonding surface 33x of the first bonding film 33a and the second bonding surface 33y of the second bonding film 33b are brought into contact with each other. The first bonding surface 33x is a surface of the first bonding film 33a. The second bonding surface 33y is a surface of the second bonding film 33b.

Next, laser light passing through the support substrate portion 20 is applied to the light absorption layer 31 via the support substrate portion 20.

The first bonding film 33a and the second bonding film 33b are melted due to heat conduction from the light absorption layer 31 heated by the laser light. Thus, the semiconductor active portion 10 and the support substrate portion 20 are bonded to each other. At this time, the laser light is scanned along the major surface 31x of the light absorption layer 31. Thus, the above melting and the above bonding are performed e.g. throughout the bonding surface 33f.

The semiconductor device 110 manufactured by this manufacturing method includes a semiconductor active portion 10, a support substrate portion 20, and a bonding portion 30. The bonding portion 30 is provided between the semiconductor active portion 10 and the support substrate portion 20. The bonding portion 30 includes a bonding layer 33 having a lower thermal conductivity than the support substrate portion 20, and a light absorption layer 31 provided between the bonding layer 33 and the support substrate portion 20. The bonding portion 30 bonds the semiconductor active portion 10 to the support substrate portion 20.

The semiconductor active portion 10 includes e.g. a semiconductor layer grown on a substrate for crystal growth. This semiconductor layer constitutes an active element of the semiconductor device. For instance, a bonding metal layer constituting a second bonding film 33b is formed on the bonding surface of the semiconductor active portion 10 to be bonded to the support substrate portion 20. The material of the second bonding film 33b can be e.g. a solder material. Alternatively, the material of the second bonding film 33b may be a metal whose melting point is lowered by alloying. For instance, the bonding portion 30 may be patterned in the shape of the semiconductor active portion 10 for bonding the semiconductor active portion 10 provided in part of a wafer.

In the embodiment, the support substrate portion 20 is made of a material transmitting laser light, whereby the laser light irradiation causes melting at the bonding surface. For instance, the support substrate portion 20 is optically transparent to laser light. Even in the case where the laser light is absorbed by the support substrate portion 20, low energy loss is desired therein. In view of the characteristics of the active element, higher thermal conductivity of the support substrate portion 20 is favorable. On the other hand, lower thermal conductivity is advantageous in view of bonding the semiconductor active portion 10 to the support substrate portion 20. A good balance therebetween is achieved, for instance, by using a semiconductor substrate made of e.g. silicon (Si), silicon carbide (SiC), diamond, or gallium nitride (GaN), or a sintered substrate made of e.g. aluminum nitride (AlN) or boron nitride (BN). Preferably, these are used for the support substrate portion 20. Considering procurement cost and productivity, a Si substrate is preferably used for the support substrate portion 20. Furthermore, in consideration of electrical connection to the semiconductor active portion 10, the semiconductor substrate may preferably have conductivity with doping in n-type or p-type.

On the side of the support substrate portion 20 facing the semiconductor active portion 10, a light absorption layer 31 for efficiently absorbing laser light and a first bonding film 33a are sequentially provided thereon.

The light absorption layer 31 has e.g. low reflectance and high light absorptance to the laser light. Thus, the laser light is efficiently transformed into heat in the light absorption layer 31. The reflectance of the light absorption layer 31 is denoted by Rm. The light absorptance of the support substrate portion 20 is denoted by r ($0<r\ll 1-Rm$). Then, when irradiating the bonding portion 30 through the support substrate portion 20 with the laser light, the energy $E_{A31}$ absorbed in the light absorption layer 31 is expressed as follows.

$$E_{A31} = (1-Rm)(1-r) \tag{1}$$

On the other hand, the energy $E_{A20}$ of laser light absorbed in the support substrate portion 20 is increased by the amount of reflection inside the substrate and expressed as follows.

$$E_{A20} = r(1+(1-r)Rm) \tag{2}$$

The relationship between $E_{A31}$ and $E_{A20}$ is expressed by the following equation (3).

$$\frac{E_{A20}}{E_{A31}} \approx \frac{1+R_m}{1-R_m} \times r \tag{3}$$

As seen from this equation, as Rm becomes higher, the ratio of the energy $E_{A20}$ absorbed in the support substrate portion 20 to the energy $E_{A31}$ absorbed in the light absorption layer 31 ($E_{A20}/E_{A31}$) becomes larger.

In the case where r is not zero, laser light is absorbed in the support substrate portion 20. Taking above discussion into consideration, the reflectance Rm of the light absorption layer 31 may be set to e.g. 60 percent (%) or less. Thus, while avoiding heating the support substrate portion 20, the light absorption layer 31 can be efficiently heated. Furthermore, thinner thickness of the light absorption layer 31 is favorable in view of heat diffusion.

The reflectance of the light absorption layer 31 is given by the following equation in terms of the refractive index n+ik of the light absorption layer 31 (k being the extinction coefficient of the light absorption layer 31) and the refractive index $n_{sub}$ of the support substrate portion 20.

$$R_m = \frac{(n-n_{sub})^2 + k^2}{(n+n_{sub})^2 + k^2} \tag{4}$$

The penetration length L of laser light into the light absorption layer 31 is expressed as follows.

$$L = \frac{\lambda}{4\pi k} \tag{5}$$

Here, $\lambda$ is the wavelength of laser light.

When the light absorption layer 31 is made thinner than the penetration length L, the absorption efficiency of laser light decreases. A material having a small penetration length L has high reflectance Rm. Thus, the absorption length L has a lower limit. Hence, the light absorption layer 31 is preferably made of a material having property parameters achieving a good balance between the thickness of the light absorption layer 31 and the absorption length L. For instance, the thickness of the light absorption layer 31 is preferably in the range of 10 nanometers (nm) or more and 2 micrometers (μm) or less. To improve the efficiency, the thickness is more preferably in the range of 10 nm or more and 200 nm or less. The penetration length L of laser light is preferably set to 1 μm or less. When the penetration length L of laser light is long, the light absorption layer 31 is required to be thicker. This results in expanding the heating region. This means the increase of the thermal energy accumulated until the temperature is increased to the target temperature. As a result, the substrate temperature is increased ultimately. On the other hand, when the light absorption layer 31 is thinner than the penetration length L, then with the decrease of light absorption in the light absorption layer 31, reflection by the bonding layer increases. This may increase substrate heating by the reflected light. Thus, the penetration length of laser light may be set to 1 μm or less. This enables use of a thin light absorption layer 31 having a small amount of heat accumulation.

The material available for the light absorption layer 31 may vary depending on the wavelength of the laser light applied thereto. For instance, the light absorption layer 31 can be made of Cr, Ti, W, Ni, V, Mn, Fe, Co, and C (except diamond) in the near infrared region and the region on the shorter wavelength side thereof. In the visible to ultraviolet region, Si and Ge can also be used in addition to Cr, Ti, W, Ni, V, Mn, Fe, Co, and C (except diamond).

Furthermore, the material of the light absorption layer 31 is preferably selected so as to be suited to the substrate included in the support substrate portion 20.

For instance, in the case where the support substrate portion 20 includes a Si substrate, the light absorption layer 31 contains at least one selected from Cr, Ti, and C. The thickness of the light absorption layer 31 is preferably 10 nm or more and 200 nm or less. In addition to the function of light absorption, Cr and Ti improve the adhesiveness between the support substrate portion 20 and the bonding portion 30. Carbon (C), except for crystalline, such as diamond, efficiently absorbs laser light. This enables low energy laser light to melt the bonding layer 33. That is, when carbon is used for the light absorption layer 31, the spot (irradiation range) of laser light may be expanded for improving the productivity.

In the embodiment, for instance, in the case where the support substrate portion 20 includes an AlN substrate as a support substrate 21, the light absorption layer 31 may contain at least one selected from Cr, Ti, C, Si, and Ge. For instance, in the case where the support substrate portion 20 includes a SiC substrate as a support substrate 21, the light absorption layer 31 may contain at least one selected from Cr, Ti, C, Si, and Ge. For instance, in the case where the support substrate portion 20 includes a GaN substrate as a support substrate 21, the light absorption layer 31 may contain at least one selected from Cr, Ti, C, Si, and Ge. For instance, in the case where the support substrate portion 20 includes a BN substrate as a support substrate 21, the light absorption layer 31 may contain at least one selected from Cr, Ti, C, Si, and Ge.

The AlN substrate, the SiC substrate, the GaN substrate, and the BN substrate transmit visible light. Thus, in the case where one of these substrates is used as the support substrate 21, the light absorption layer 31 can be heated by e.g. a visible light laser. The light absorption layer 31 can be made of Si or Ge, which absorbs visible light. The light absorptance of Si and Ge is relatively high. Thus, it becomes possible to heat the light absorption layer 31 using low energy laser light, when Si or Ge is contained therein.

In the case of using a laser in the short wavelength region including ultraviolet radiation, the choice of the support substrate 21 transmitting laser light is narrowed. However, various metals except Al and Ag can be used for the light absorption layer 31. For instance, the first bonding film 33a may be made of a metal absorbing laser light. Thus, part of the metal layer in the first bonding film 33a can be used as the light absorption layer 31.

The first bonding film 33a is preferably made of an identical material or the one having similar properties to those of the second bonding film 33b. The material of the first bonding film 33a and the material of the second bonding film 33b may be alloyed to make the melting point lower.

The melting point of the first bonding film 33a and the second bonding film 33b is preferably e.g. 100° C. or more and 300° C. or less. This can suppress the influence on the electrode provided on the semiconductor active portion 10. The lower limit of each thickness of the first bonding film 33a and the second bonding film 33b is the thickness that may absorb the height of fine unevenness of the first bonding surface 33x and the second bonding surface 33y to suppress the occurrence of voids and the like. The upper limit of the total thickness of the bonding layer 33 combining the first bonding film 33a and the second bonding film 33b is determined by their thermal conductivity, and is e.g. 3 μm. Furthermore, the total thickness of the light absorption layer 31, the first bonding film 33a, and the second bonding film 33b is preferably 3 μm or less.

In view of productivity, processability, and electrical resistance, it may be preferable that the first bonding film 33a and the second bonding film 33b be made of different materials.

Figure 2A:
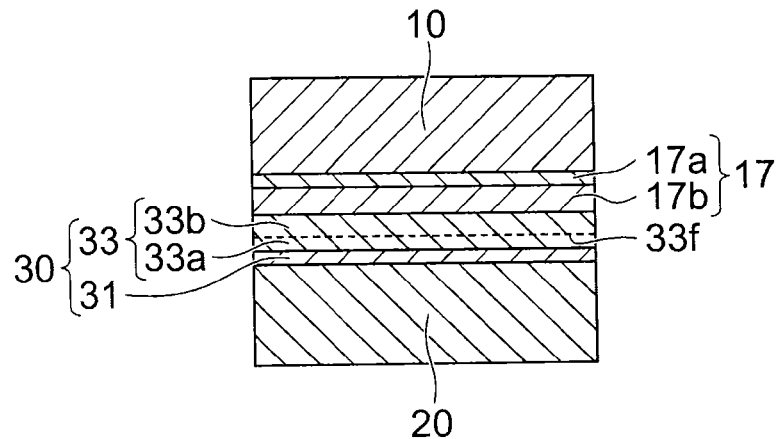
FIGS. 2A to 2C are schematic sectional views illustrating a manufacturing method of the semiconductor device according to the first embodiment.
Figure 2B:
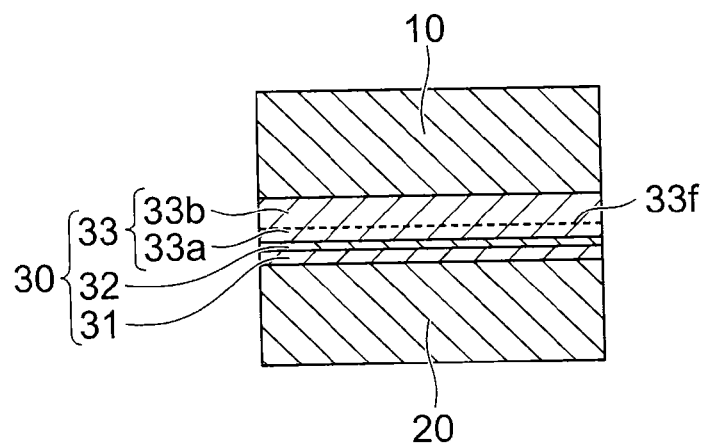
Figure 2C:
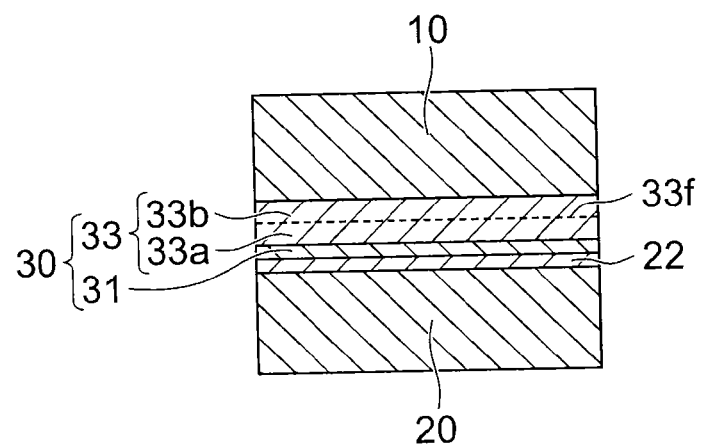

FIGS. 2A to 2C are schematic sectional views illustrating a semiconductor manufacturing method according to the first embodiment.

As shown in FIG. 2A, an intermediate layer 17 may be provided between the semiconductor active portion 10 and the second bonding film 33b (e.g., solder material). For instance, the entirety of the intermediate layer 17, or a first portion 17a of the intermediate layer 17 in contact with the semiconductor active portion may be used as a reflection layer. For instance, in the case where the function of the semiconductor active portion 10 is light emission, the reflectance of the intermediate layer 17 for the light emitted from the semiconductor active portion 10 is made higher than that of the second bonding film 33b. This can suppress optical loss in the second bonding film 33b and increase the efficiency of light extraction from the semiconductor active portion 10 to the outside.

Alternatively, for instance, the electrode in contact with the semiconductor active portion 10 constitutes an intermediate layer 17. For instance, the semiconductor active portion 10 and the support substrate portion 20 are electrically connected via the intermediate layer 17. As described above, the first portion 17a of the intermediate layer 17 may be a reflection electrode layer for reflecting the light emitted by the semiconductor active portion 10. A second portion 17b of the intermediate layer 17 between the first portion 17a and the second bonding film 33b can be used as e.g. a spacer layer. The spacer layer has the function of e.g. delaying heat diffusion. Furthermore, the spacer layer may be provided with the function of suppressing diffusion of metal. The second portion 17b functioning as a spacer layer can be made of e.g. a metal such as solder material and Ti. Such a spacer layer can suppress thermal damage to e.g. the interface between the semiconductor active portion 10 and the first portion 17a, the semiconductor active portion 10, and the first portion 17a. In the case of providing a spacer layer, the thickness is controlled by e.g. selecting a material that does not significantly increase the thermal resistivity of the entire semiconductor device.

As shown in FIG. 2B, a first barrier layer 32 may be inserted between the light absorption layer 31 and the first bonding film 33a. This first barrier layer 32 is made of a material different from the light absorption layer 31 and the first bonding film 33a. The first barrier layer 32 suppresses diffusion of metal (such as Ag or Au) migrating from the bonding layer 33 through the light absorption layer 31 to the support substrate 21.

The first barrier layer 32 may include a plurality of layers made of different materials. Preferably, the thermal conductivity of the first barrier layer 32 is sufficiently higher than the thermal conductivity of the first bonding film 33a. Preferably, the thickness of the first barrier layer is sufficiently thinner than that of the first bonding film 33a.

As shown in FIG. 2C, a second barrier layer 22 made of a different material is provided between the support substrate 21 and the light absorption layer 31. This suppresses diffusion of metal contained in the light absorption layer 31 into the support substrate 21. Thus, the resistance between the support substrate 21 and the light absorption layer 31 can be reduced, or the increase of the resistance can be suppressed. To avoid blocking of laser light reaching the light absorption layer 31, the thickness of the second barrier layer 22 is set to 10 nm or less, and preferably 5 nm or less. The second barrier layer 22 may be transparent to laser light.

Figure 3A:
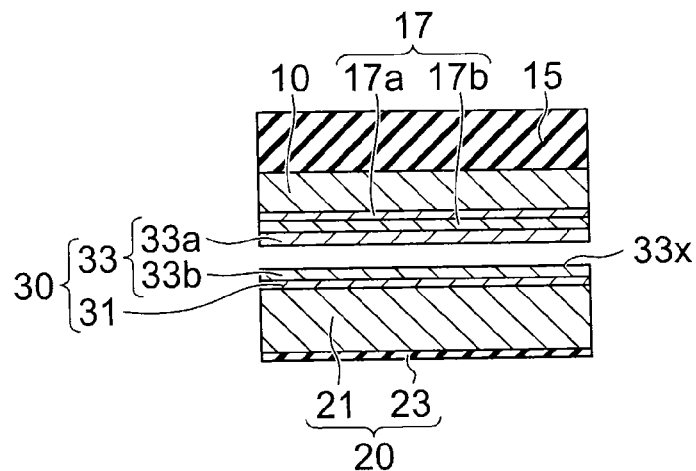
FIGS. 3A to 3C are schematic sectional views illustrating a manufacturing method of the semiconductor device according to the first embodiment.
Figure 3B:
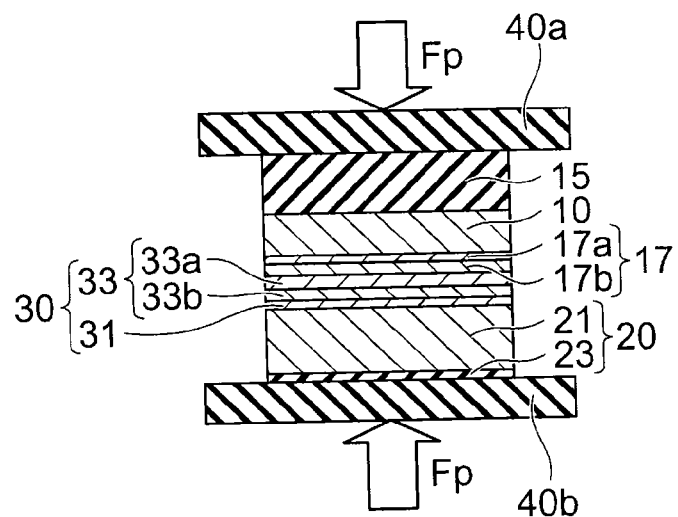
Figure 3C:
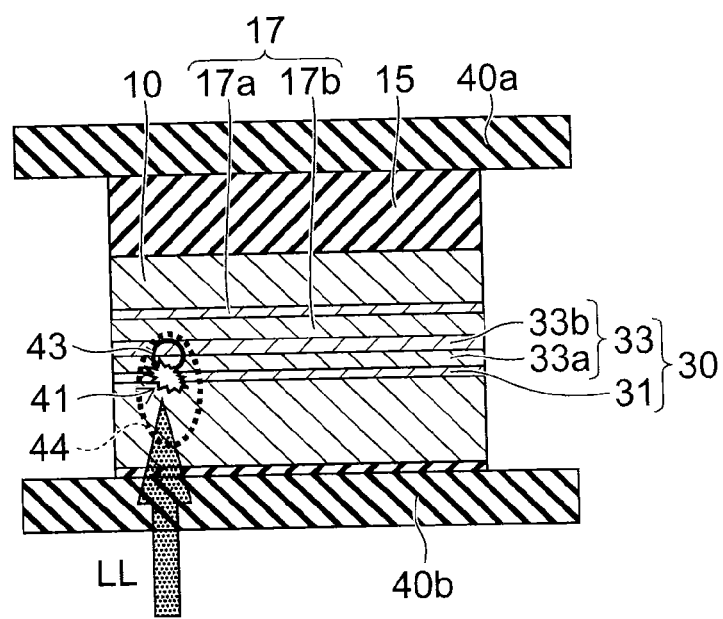

FIGS. 3A to 3C are schematic sectional views showing a manufacturing method of a semiconductor device according to the first embodiment. In the description of this example, a semiconductor active portion 10 containing nitride is crystal grown on a sapphire substrate 15. The semiconductor active portion 10 is bonded to a support substrate portion 20 including a support substrate 21 being a Si substrate.

FIG. 3A shows the semiconductor active portion 10 and the support substrate portion 20 opposed to each other. FIG. 3B shows the first bonding surface 33x and the second bonding surface 33y brought into tight contact with each other by pressurization. FIG. 3C shows the light absorption layer 31 irradiated with laser light from the support substrate portion 20 side.

The semiconductor active portion 10 shown in FIG. 3A includes e.g. a nitride semiconductor layer. The nitride semiconductor layer is a semiconductor layer having a thickness of approximately 7 μm stacked on the sapphire substrate 15 having a thickness of 200 μm.

The semiconductor active portion 10 includes e.g. the light emitting section of a semiconductor light emitting element. The first portion 17a of the intermediate layer 17 includes an Ag film having a thickness of 140 nm and a Ni film having a thickness of 60 nm sequentially stacked from the nitride semiconductor layer 13 side. The first portion 17a reflects the light emission emitted from the nitride semiconductor layer 13. Furthermore, the second portion 17b of the intermediate layer 17 includes Ti having a thickness of 60 nm and protects the first portion 17a. For instance, the second portion 17b prevents interdiffusion of metal atoms between the first portion 17a and the bonding layer 33. Furthermore, the second portion 17b is made of a material having low thermal conductivity. Thus, the second portion 17b functions as a delay layer for delaying conduction of heat from the bonding layer 33 to the semiconductor active portion 10.

The second bonding film 33b includes Au having a thickness of 1100 nm and AuSn having a thickness of 620 nm sequentially stacked from the second portion 17b side.

On the other hand, the support substrate portion 20 includes a p-type Si substrate (support substrate 21) having a thickness of 300 μm and an antireflection layer 23 having a thickness of approximately 208 nm. The antireflection layer 23 is provided on the laser light irradiation side of the p-type Si substrate. The antireflection layer 23 can be made of e.g. a mixture of $SiO_2$ and $Si_3N_4$ (refractive index 1.86). Alternatively, the antireflection layer 23 may be made of e.g. $Y_2O_3$ or $Al_2O_3$. The refractive index of these materials is relatively close to 1.86.

Because of the high refractive index of the support substrate 21, interference of laser light may occur due to multiple reflection inside the support substrate 21. This multiple reflection can be suppressed by providing the antireflection layer 23 on the opposite side of the support substrate 21 from the first bonding surface 33x. The antireflection layer 23 can be removed by a method such as polishing after the bonding step. The antireflection layer 23 may be made of an insulator.

On the other hand, on the surface of the support substrate 21 on the first bonding surface 33x side, a Cr layer having a thickness of 60 nm is formed as a light absorption layer 31. Furthermore, on the Cr layer, an AuSn solder layer having a thickness of 760 nm is stacked as a first bonding film 33a.

The first portion 17a of the intermediate layer 17 may contain Ag, and the first bonding film 33a and the second bonding film 33b may contain Au. In this case, these metals may be diffused into the support substrate 21 and alloyed, and the resistance of the alloyed region may be increased. The portion with increased resistance prevents passage of current through the support substrate 21. In this embodiment, for instance, the second portion 17b of the intermediate layer 17 and the light absorption layer 31 suppress diffusion of Ag and Au.

Next, as shown in FIG. 3B, with the second bonding film 33b and the first bonding film 33a opposed to each other, the semiconductor active portion 10 and the support substrate portion 20 are placed between the an upper holder 40a and a lower holder 40b. Then, a pressure $F_p$ is applied from the rear surface side of the sapphire substrate 15 and the rear surface side (antireflection layer 23 side) of the support substrate portion 20. Thus, the first bonding film 33a and the second bonding film 33b are brought into tight contact with each other.

As shown in FIG. 3C, laser light LL having a wavelength of 1550 nm is applied from the rear surface side of the support substrate portion 20. The lower holder 40b, the antireflection layer 23, and the support substrate 21 transmit the laser light of wavelength 1550 nm. Thus, the laser light LL transmitted through the lower holder 40b and the support substrate portion 20 is applied to the light absorption layer 31. Accordingly, the light absorption layer 31 is heated at the irradiation position 41 of the laser light LL. The generated heat diffuses and increases the temperature of the neighborhood (heating region 44) of the irradiation position 41. The temperature of a partial region 43 of the heating region 44 in the bonding layer 33 is made higher than its melting point. Then, the first bonding film 33a and the second bonding film 33b are melted and bonded together. Furthermore, the laser light LL is scanned along the major surface of the light absorption layer 31. Thus, the first bonding film 33a and the second bonding film 33b are melted. Accordingly, the semiconductor active portion 10 and the support substrate portion 20 can be bonded to each other.

For instance, the thermal conductivity of the support substrate 21 is made higher than or equal to the thermal conductivity of the bonding layer 33 by a factor of one or more and ten or less. Thus, the thermal energy generated in the light absorption layer 31 flows more into the support substrate 21 than into the bonding layer 33. For instance, the layer thickness of the bonding layer 33 heated is set to 1/400 or less of the thickness of the support substrate 21. The thickness of the support substrate 21 is 1 mm or less, and even in special cases, 2 mm or less. Thus, the thickness of the portion of the bonding layer 33 to be subjected to temperature increase is set to 5 μm or less at the maximum. Furthermore, the thickness of the first bonding film 33a may be set to 4 μm or less. For instance, even in consideration of the contact thermal resistance between the first bonding film 33a and the second bonding film 33b, preferably, the first bonding film 33a is heated, and furthermore, the second bonding film 33b is heated to the range of 500 nm or more from the bonding interface 33f.

In the manufacturing method according to the embodiment, the irradiation energy density of the laser light LL and the irradiation time are suitably controlled. Thus, the bonding layer 33 is rapidly melted. Simultaneously, the temperature increase of the laser irradiation position on the support substrate 21 can be restricted to a region around the bonding interface. The heat generated by laser irradiation diffuses in a wide range of the support substrate portion 20, and increases the temperature of the support substrate 21 to a certain temperature. Minimizing the total amount of irradiation energy of the laser light LL may suppress the increase of the temperature of the support substrate 21. That is, according to the embodiment, the increase of the temperature of the semiconductor active portion 10 and the support substrate portion 20 can be suppressed as compared with the bonding method of entirely heating the semiconductor active portion 10 and the support substrate portion 20. This can suppress problems due to temperature increase or decrease, such as stress resulting from the difference in linear thermal expansion coefficient between the semiconductor active portion 10 and the support substrate 21.

FIGS. 4A to 7B are graphs showing characteristics in the manufacturing method according to the embodiment. These figures show simulation results for the characteristics in the manufacturing method according to the embodiment.

The spatial resolution in the simulation is set to 20 nm. The influence of thermal stress and the temperature dependence of thermal conductivity are omitted in the simulation. The contact thermal resistance at the bonding surface 33f between the bonding film 33a and the bonding film 33b is substituted by increasing the thickness of the bonding portion 33 by 20 nm. The thermal conductivity $T_C$, specific heat $H_S$, and density $D_w$ used in the simulation are listed in TABLE 1.

TABLE 1

|  | Tc (W/m · K) | Hs (J/Kg · K) | Dw (g/cm$^{-3}$) |
|---|---|---|---|
| Si | 148.0 | 700.0 | 2.330 |
| Cr | 93.9 | 450.0 | 7.150 |
| Ti | 21.9 | 520.0 | 4.507 |
| Ni | 90.7 | 440.0 | 8.908 |
| Au | 317.0 | 128.0 | 19.30 |
| AuSn | 57.0 | 140.0 | 14.50 |
| In | 81.6 | 223.0 | 7.310 |
| Ag | 429.0 | 232.0 | 10.49 |
| GaN | 130.0 | 490.0 | 6.150 |
| Sapphire | 41.0 | 750.0 | 3.987 |

The simulation assumes the condition that the temperature of the heating region (region 43, see FIG. 3C) in the bonding layer 33 is increased by 260 degrees or more from the temperature before laser irradiation. This condition is equivalent to heating up to 280° C. at room temperature 20° C., and corresponds to a condition for melting AuSn solder.

The characteristics under three conditions are now described: the condition that the support substrate 21 has no light absorption (hereinafter condition CA); the condition that the support substrate 21 has a light absorptance of 4 cm$^{-1}$ (hereinafter condition CB); and the condition that the support substrate 21 has a light absorptance of 10 cm$^{-1}$ (hereinafter condition CC).

Figure 4A:
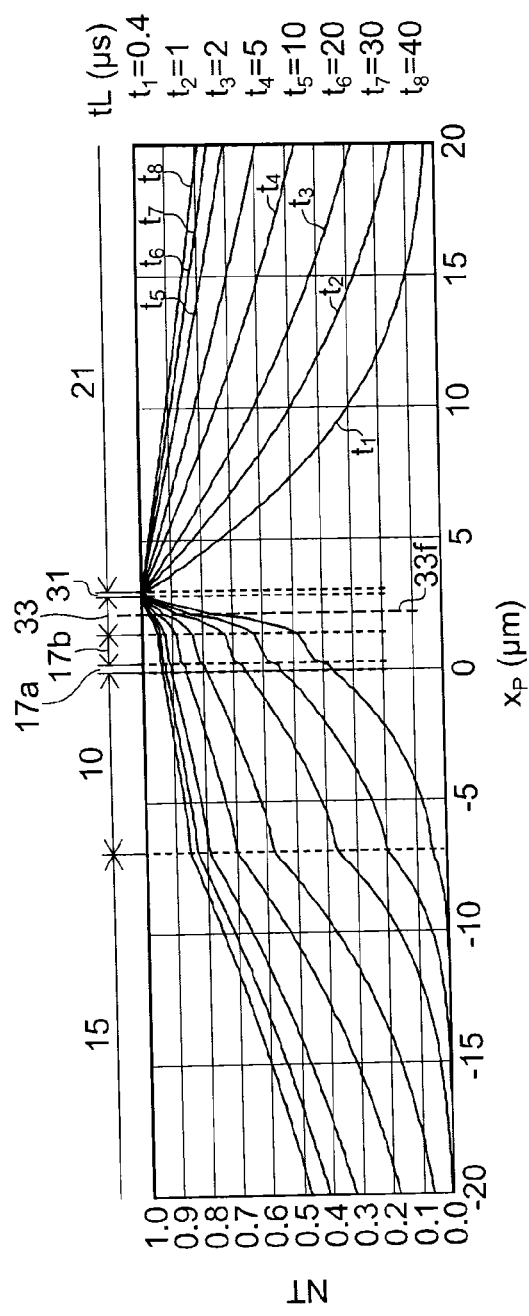
FIGS. 4A to 7B are graphs showing characteristics in the manufacturing method according to the first embodiment.
Figure 4B:
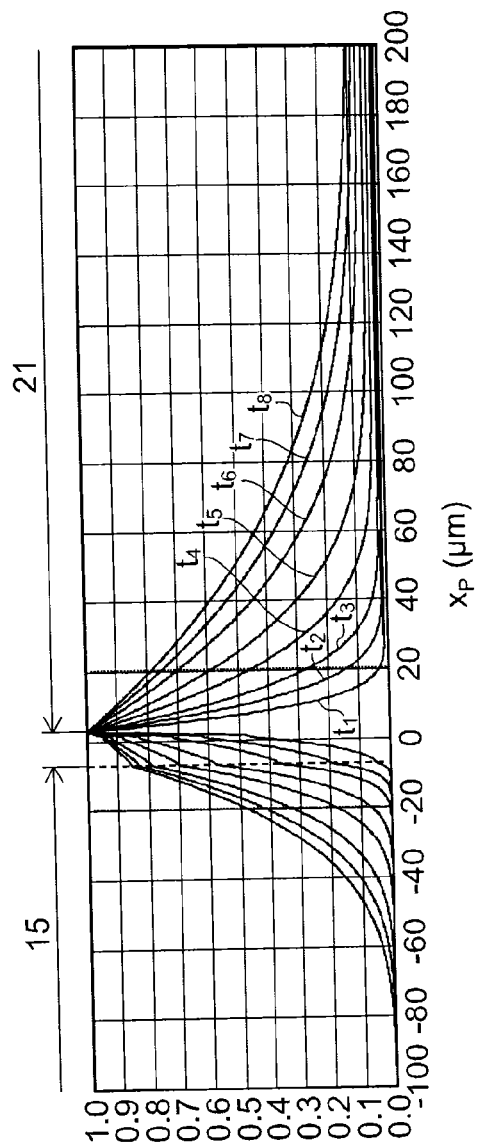

FIGS. 4A and 4B are graphs showing the result of simulating diffusion of heat in the semiconductor active portion 10 and the support substrate portion 20 to determine the temperature distribution. FIG. 4A is a graph in which the region around the bonding surface 33f in FIG. 4B is enlarged. The horizontal axis represents the position $x_p$ in the direction perpendicular to the bonding surface 33f. The vertical axis represents the normalized temperature NT with reference to the temperature of the light absorption layer 31.

As shown in FIGS. 4A and 4B, as the irradiation time $t_L$ is made longer from $t_1$ to $t_8$, the temperature of the support substrate 21 and the temperature of the semiconductor active portion 10 increase. This indicates that as the irradiation time $t_L$ becomes longer, diffusion of heat to the surroundings increases.

In this simulation, the light absorption layer 31 is a Cr layer. The penetration length of Cr is 29.4 nm at a laser light wavelength of 1550 nm. The reflectance Rm at the interface between Cr and Si is 25.68%. For instance, a Cr layer having a thickness of 100 nm transforms approximately 72% of applied laser light into heat. A Cr layer having a thickness of 60 nm transforms approximately 65% of applied laser light into heat. In consideration of the distribution of light absorption in the Cr layer, as viewed from the laser light irradiation side, 36.7% is transformed in the first 20 nm, and 18.6% is transformed in the next 20 nm. Furthermore, 9.4% of the energy is transformed in the next 20 nm.

Figure 5:
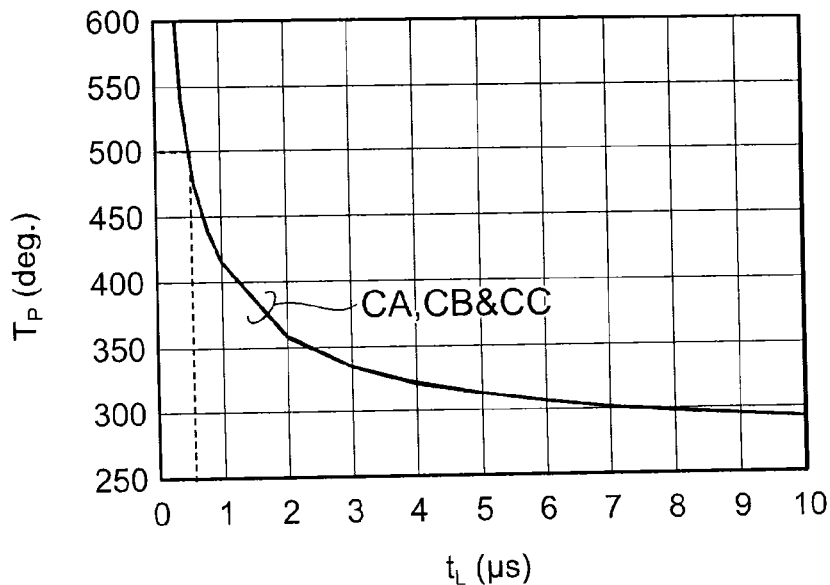

FIG. 5 shows the relationship between the irradiation time $t_L$ of laser light for increasing the temperature of the bonding layer 33 by 260 degrees from the temperature before heating, and the peak temperature $T_p$ of the light absorption layer 31. The horizontal axis represents the laser irradiation time $t_L$. The vertical axis represents the peak temperature $T_p$. The peak temperature $T_p$ is the difference between room temperature and the maximum temperature reached by the light absorption layer 31 when supplied with energy sufficient for increasing the temperature of the bonding layer 33 by 260 degrees within the laser irradiation time.

As shown in FIG. 5, the peak temperature $T_p$ can be suppressed by lengthening the laser irradiation time $t_L$. That is, when the temperature of the bonding layer 33 is increased to the target temperature, if the irradiation time $t_L$ is short, the peak temperature $T_p$ of the light absorption layer 31 is set to a high temperature. If the irradiation time $t_L$ is long, the peak temperature $T_p$ of the light absorption layer 31 may be made low. On the other hand, as shown in FIGS. 4A and 4B, if the irradiation time $t_L$ is made longer, the temperature of the support substrate 21 and the semiconductor active portion 10 increases. Thus, preferably, to the extent that the peak temperature $T_p$ of the light absorption layer 31 does not become too high, the irradiation time $t_L$ is set to be short to suppress the temperature of the support substrate 21 and the semiconductor active portion 10.

For instance, AuSn contained in the bonding layer 33 has low thermal conductivity. Thus, if the temperature is increased within an excessively short time, the temperature of the light absorption layer 31 becomes too high. This is not appropriate. For instance, when the irradiation time of laser light is set to 0.6 microseconds (μs) or less, the temperature of AuSn contained in the bonding layer 33 can be increased to the melting point while suppressing the amount of temperature increase of the light absorption layer 31 to 500 degrees or less.

Here, FIG. 5 shows the relationship between the irradiation time of laser light and the peak temperature for the conditions CA, CB, and CC. However, there is little difference among the conditions.

Figure 6A:
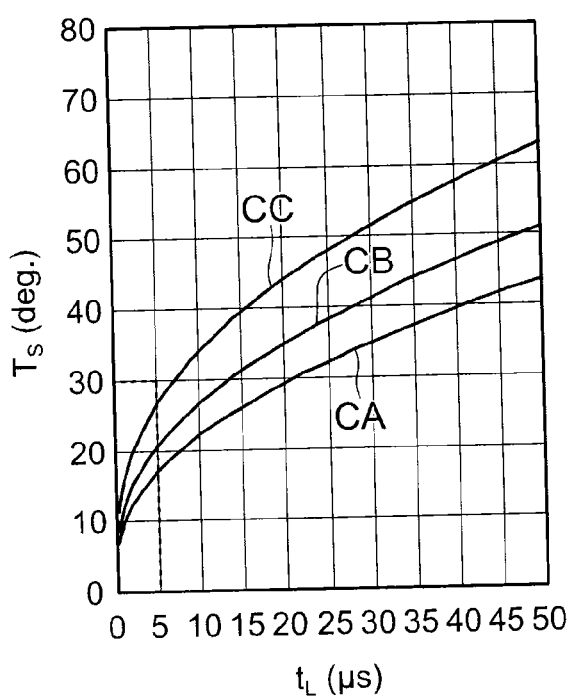
Figure 6B:
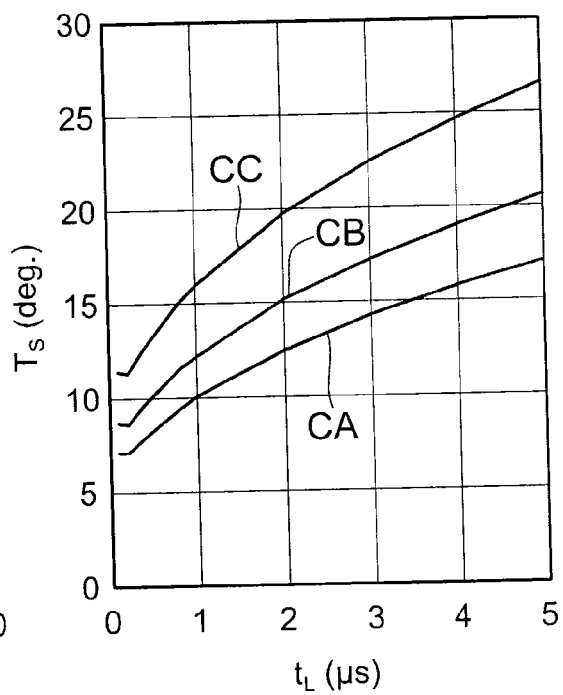

FIGS. 6A and 6B are graphs showing the relationship between the steady temperature $T_S$ (the amount of temperature increase from the initial temperature) of the support substrate 21 and the irradiation time $t_L$ of laser light in the case of increasing the temperature of the bonding layer 33 by 260 degrees. FIG. 6B is a graph in which a short range of the irradiation time $t_L$ indicated by a dashed line in FIG. 6A is enlarged. The horizontal axis represents the laser irradiation time $t_L$. The vertical axis represents the steady temperature $T_S$. Here, the steady temperature $T_S$ is the difference between room temperature and the temperature of the support substrate 21 having reached the steady state.

As shown in FIGS. 6A and 6B, the steady temperature $T_S$ monotonically increases with the laser irradiation time $t_L$. Under the condition CA, the light absorption of the support substrate is 0 (zero). Thus, the steady temperature $T_S$ corresponds to the amount of temperature increase due to thermal conduction from the light absorption layer 31. Under the conditions CB and CC, the temperature increase due to light absorption in the support substrate 21 is added to the amount of increase under the condition CA. That is, as the light absorptance becomes higher, the temperature increase of the support substrate 21 becomes greater.

In order to suppress thermal damage to the semiconductor active portion 10, it is preferable that the temperature of the support substrate 21 be lower. The upper limit of the temperature of the support substrate 21 depends on various factors such as the area of the bonding surface, the difference in expansion coefficient, and the thickness of the support substrate 21. The upper limit of the temperature may also depend on e.g. the allowable yield of the manufacturing line and empirical values. For instance, consider the case of suppressing the temperature of the support substrate 21 (Si substrate) to 60° C. or less, i.e., the amount of temperature increase to 40 degrees or less. The laser irradiation time $t_L$ corresponding thereto is 40 microseconds (μs) or less for the condition CA, 27 μs or less for the condition CB, and 17 μs or less for the condition CC. Thus, the irradiation time of laser light at one irradiation position of the support substrate 21 is 0.6-40 μs for the condition CA, 0.6-27 μs for the condition CB, and 0.6-17 μs for the condition CC.

Figure 7A:
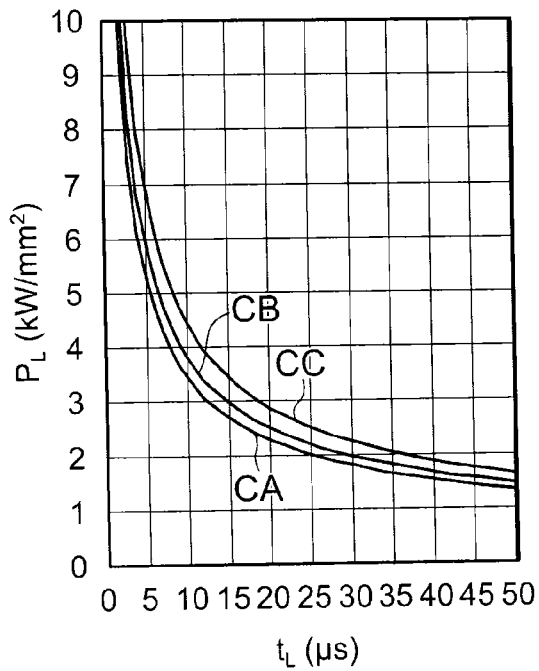
Figure 7B:
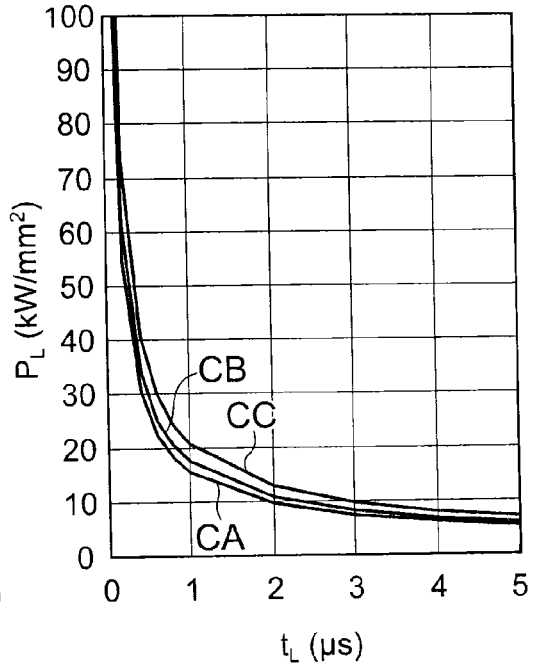

FIGS. 7A and 7B are graphs showing the relationship between the energy density $P_L$ of laser light and the laser irradiation time $t_L$ for increasing the temperature of the bonding layer 33 by 260 degrees. The horizontal axis represents the laser irradiation time $t_L$. The vertical axis represents the energy density $P_L$ of laser light. FIG. 7B shows an enlarged view of the range 0-5 μs of the irradiation time in FIG. 7A.

As shown in FIGS. 7A and 7B, the energy density $P_L$ of laser light increases in the order of the conditions CA, CB, and CC. There is no significant difference among the conditions CA, CB, and CC. For instance, in the case where the irradiation time $t_L$ is 1 μs, an energy density $P_L$ of 16-21 kW/mm² is required. Such energy density $P_L$ can be realized by focusing the output light of a 1 kW fiber laser on a spot having a radius of 120-140 μm. For an irradiation time of 20 μs, the energy density $P_L$ is 2.3-2.9 kW/mm². In this case, the spot radius can be expanded to 330-370 μm. For instance, one LED chip with a length of 500 μm on a side can be bonded by one shot.

Next, simulation results for the light absorption layer 31 made of Cr, Co, Fe, Ni, Ti, or W are shown. For the materials used for the light absorption layer 31, the refractive index $R_1$, reflectance $R_f$ of the Si interface, penetration length L, thermal conductivity $T_C$, specific heat $H_S$, and density $D_w$ listed in TABLE 2 are used. The thickness of the light absorption layer 31 is 100 nm. Here, for the semiconductor active portion 10, the bonding layer 33, and the support substrate 21, the property parameters listed in TABLE 1 are used. The light absorptance of the support substrate 21 is set to 10 cm⁻¹ (condition CC).

TABLE 2

|    | $R_1$ $\lambda = 1.55$ μm | $R_f$ (%) | L (nm) | $T_c$ (W/m·K) | $H_s$ (J/Kg·K) | $D_w$ (g/cm⁻³) |
|----|---------------------------|-----------|--------|---------------|----------------|-----------------|
| Cr | 3.667 + 4.93i             | 25.7      | 29.42  | 93.9          | 450.0          | 7.150           |
| Ti | 3.684 + 4.609i            | 29.4      | 26.76  | 21.9          | 520.0          | 4.507           |
| Ni | 3.095 + 7.741i            | 58.3      | 15.93  | 90.7          | 440.0          | 8.908           |
| Co | 5.17 + 5.89i              | 34.3      | 20.94  | 100.0         | 420.0          | 8.900           |
| Fe | 3.105 + 5.251i            | 39.1      | 23.49  | 80.2          | 440.0          | 7.874           |
| W  | 2.242 + 4.844i            | 44.5      | 25.46  | 174.0         | 130.0          | 19.250          |

FIGS. 8A to 10B are graphs showing characteristics in an alternative manufacturing method according to this embodiment.

Figure 8A:
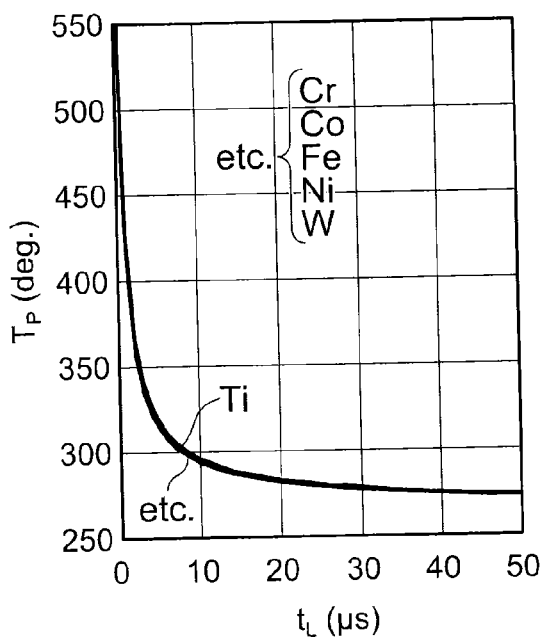
FIGS. 8A to 10B are graphs showing characteristics in an alternative manufacturing method according to the first embodiment.
Figure 8B:
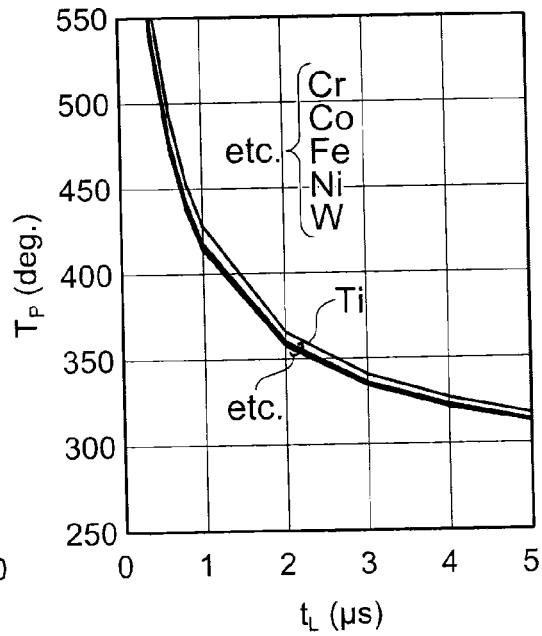

FIGS. 8A and 8B are graphs showing the relationship between the irradiation time $t_L$ of laser light for increasing the temperature of the bonding layer 33 by 260 degrees from the temperature before heating, and the peak temperature $T_p$ of the light absorption layer 31. FIG. 8B shows an enlarged view of the range 0-5 μs in FIG. 8A. This example corresponds to the case where the energy of laser light is adjusted so that AuSn solder contained in the bonding layer 33 is set to 280° C. or more at room temperature 20° C.

As seen from FIGS. 8A and 8B, the relationship between the peak temperature $T_p$ of the light absorption layer 31 and the irradiation time $t_L$ of laser light for metals except Ti exhibits substantially the same characteristics as that for Cr. The peak temperature $T_p$ for the light absorption layer 31 being a Ti layer is slightly higher than that for the other metals. This is because Ti has lower thermal conductivity than the other metals, and hence heat is not easily diffused from the light absorption layer 31.

Figure 9A:
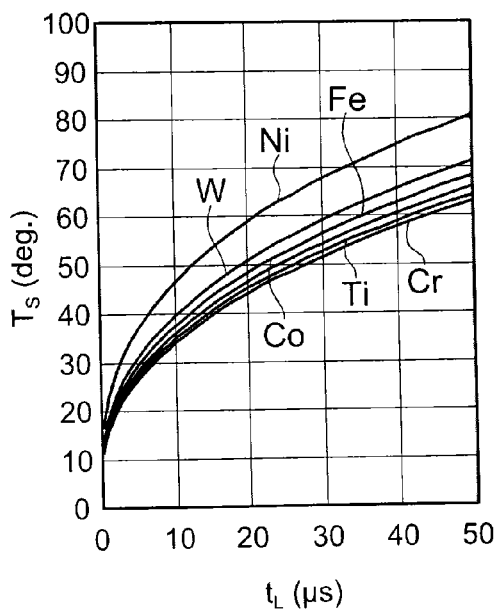
Figure 9B:
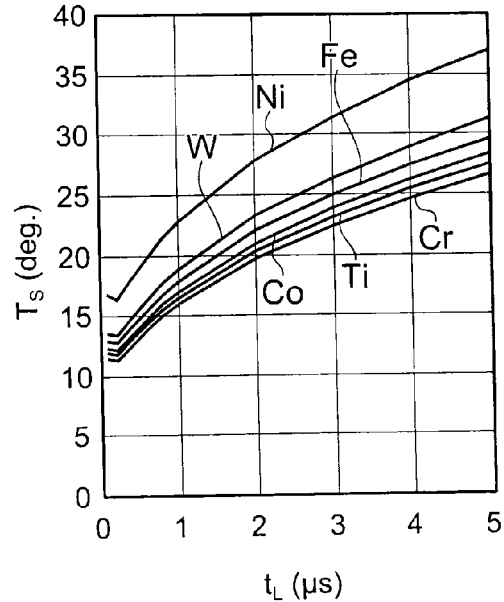

FIGS. 9A and 9B are graphs showing the relationship between the steady temperature $T_S$ (the amount of temperature increase from the initial temperature) of the support substrate 21 and the irradiation time $t_L$ of laser light in the case of increasing the temperature of the bonding layer 33 by 260 degrees. FIG. 9B is a graph in which a short range of the irradiation time $t_L$ indicated by a dashed line in FIG. 9A is enlarged. The horizontal axis represents the laser irradiation time $t_L$. The vertical axis represents the steady temperature $T_S$.

As shown in FIGS. 9A and 9B, the steady temperature $T_S$ monotonically increases with the increase of the laser irradiation time $t_L$. The steady temperature $T_S$ increases in the order of Cr, Ti, Co, Fe, W, and Ni. With reference to TABLE 2, it is found that the steady temperature $T_S$ depends on the reflectance $R_f$ of the interface between each metal and the support substrate 21. Among the metals listed here, Ni has the highest reflectance, and accordingly, the applied laser light yields higher energy. For instance, for an irradiation time of 20 μs, Ni is heated to a higher temperature by approximately 15 degrees than Cr. Thus, use of Ni for the light absorption layer 31 increases the temperature of the support substrate 21 higher than the other materials. On the other hand, Ni has a shallower penetration length L, and accordingly, the thickness of the light absorption layer 31 can be thinned. Depending on the purpose and application of the semiconductor active portion 10, Ni can be used for the light absorption layer 31.

Figure 10A:
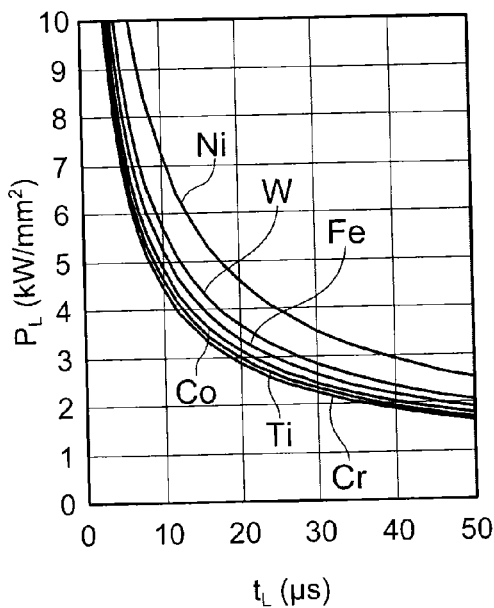
Figure 10B:
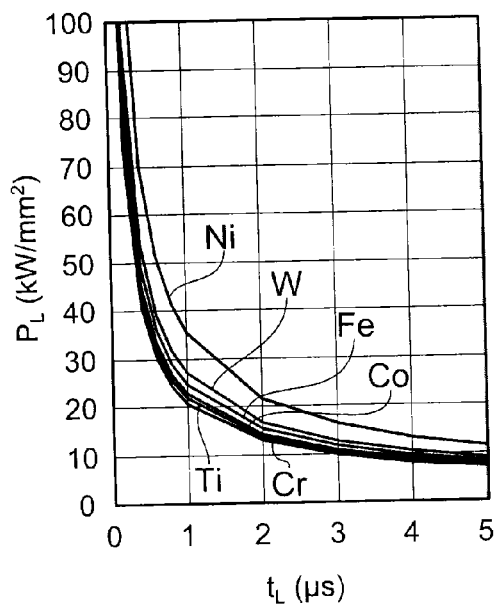

FIGS. 10A and 10B show the relationship between the energy density $P_L$ of laser light and the laser irradiation time $t_L$ in the case of increasing the temperature of the bonding layer 33 by 260 degrees. The horizontal axis represents the laser irradiation time $t_L$. The vertical axis represents the energy density $P_L$ of laser light. FIG. 10B shows an enlarged view of the range 0-5 μs of the irradiation time $t_L$ in FIG. 10A.

The energy density $P_L$ of laser light becomes higher as the irradiation time $t_L$ becomes shorter. Furthermore, with regard to the material of the light absorption layer 31, the energy density $P_L$ of laser light becomes higher in the order of Cr, Ti, Co, Fe, W, and Ni. That is, the energy density $P_L$ of laser light depends on the reflectance $R_f$ at the interface between the light absorption layer 31 and the support substrate 21. That is, as the reflectance $R_f$ becomes lower, the energy $P_L$ of the applied laser light can be made lower.

The manufacturing method according to this embodiment can bond the support substrate portion 20 and the semiconductor active portion 10 by selectively heating the region around the bonding interface while suppressing the temperature increase of the support substrate portion 20. Furthermore, the manufacturing method according to the embodiment minimally suppresses damage to the semiconductor active portion 10 due to stress or heat resulting from the difference in thermal expansion.

In this context, there is a method of placing light absorbers such as pigments at the interface between two organic polymer layers, irradiating the pigments with laser light to partially heat the polymer around the pigments, and fusing the two polymer layers. This method uses an organic polymer, which has high thermoplasticity and low thermal conductivity. Thus, this method is not suited to semiconductor manufacturing.

Furthermore, for instance, there is a technique of laser light irradiation through a transparent mounting substrate to melt solder, thereby bonding a semiconductor chip to the mounting substrate. However, in this case, the light absorption layer heated by laser light is not used. Furthermore, the thermal conductivity of the mounting substrate is lower than the thermal conductivity of solder. Thus, with the melting of solder, the temperature of the semiconductor chip also increases and may cause thermal damage to the semiconductor active portion.

In contrast, this embodiment can suppress the temperature increase of both the semiconductor active portion 10 and the support substrate portion 20. Thus, thermal damage to the semiconductor active portion 10 can be suppressed.

Second Embodiment

Figure 11A:
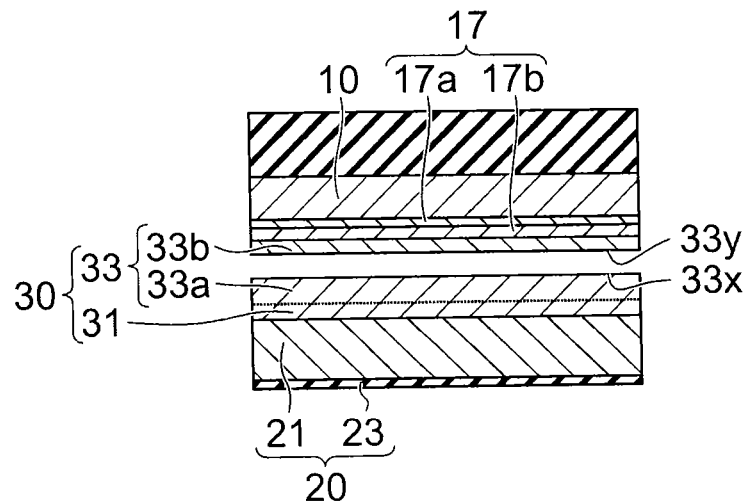
FIGS. 11A to 12 are schematic sectional views illustrating a manufacturing method of a semiconductor device according to a second embodiment.
Figure 11B:
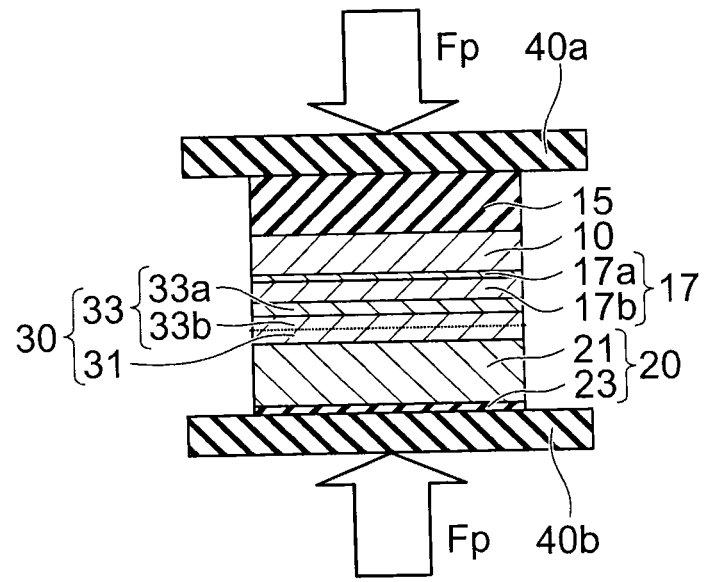
Figure 12:
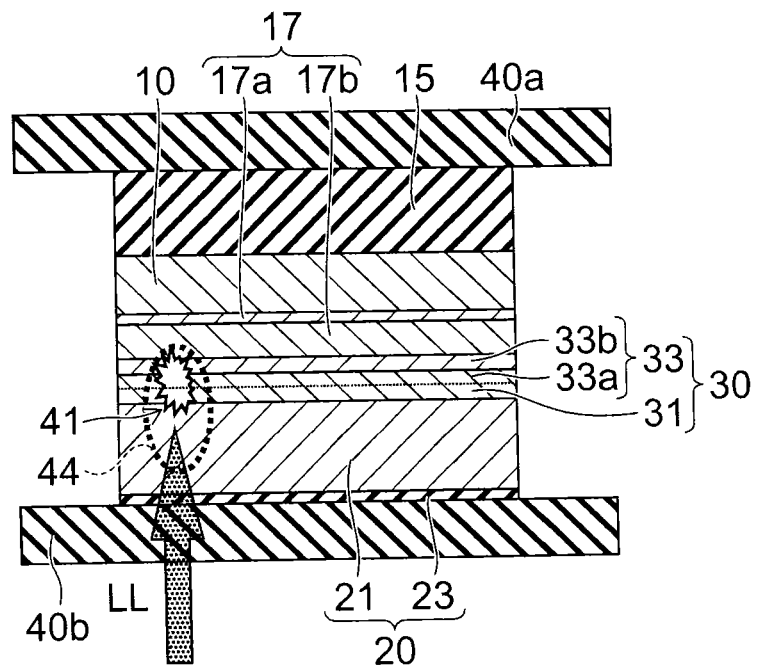

FIGS. 11A to 12 are schematic sectional views illustrating a manufacturing method of a semiconductor device according to a second embodiment.

FIG. 11A shows the semiconductor active portion 10 and the support substrate portion 20 opposed to each other. FIG. 11B shows the first bonding surface 33x and the second bonding surface 33y brought into tight contact with each other by pressurization. FIG. 12 shows the light absorption layer 31 irradiated with laser light from the support substrate portion 20 side to melt the bonding layer 33.

In the embodiment, the light absorption layer 31 is made of the same material as the first bonding film 33a. That is, for instance, part of the layer constituting the first bonding film 33a serves as a light absorption layer 31. The rest of the configuration is similar to that of the first embodiment. In this example, a layer having a light absorption function and a bonding function is provided on the support substrate 21. The surface portion of the layer constitutes a first bonding film 33a. The portion of the layer between the support substrate 21 and the first bonding film 33a (e.g., the portion in contact with the support substrate 21) constitutes a light absorption layer 31.

A material having a light absorption function and a bonding function is used for the light absorption layer 31 and the first bonding film 33a (bonding layer 33). In this case, the layer thickness of the bonding layer 33 (first bonding film 33a) can be made comparable to the penetration length L of laser light. Then, the peak temperature of the bonding layer 33 heated by laser light can be made lower than that in the case of e.g. separately providing the light absorption layer 31 and the bonding layer 33. Furthermore, in this embodiment, the upper limit of the thickness of the bonding layer 33 is the longer of 4 μm described above and the penetration length L. Thus, the restriction on the thickness of the bonding layer 33 is relaxed.

Furthermore, as described above, the layer provided between the bonding layer 33 and the support substrate 21 functions to suppress diffusion of metal atoms. This can suppress formation of a high resistance layer by diffusion of e.g. Au contained in the bonding layer 33 or Ag contained in the first portion 17a of the intermediate layer 17 into the support substrate 21. Thus, this embodiment is applied to the case where the bonding layer 33 and the intermediate layer 17 do not contain an element increasing the resistance of the support substrate 21.

Third Embodiment

Figure 13:
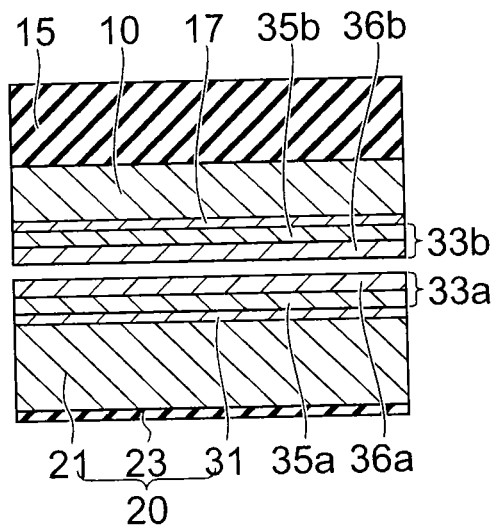
FIG. 13 is a schematic sectional view illustrating a manufacturing method of a semiconductor device according to a third embodiment.

FIG. 13 is a schematic sectional view illustrating a manufacturing method of a semiconductor device according to a third embodiment. In this embodiment, a stacked structure of Au/In is applied to the second bonding film 33b and the first bonding film 33a. The rest is the same as the first embodiment.

As shown in FIG. 13, on the semiconductor active portion 10 side, from the side nearer to the intermediate layer 17, a second Au layer 35b and a second In layer 36b are stacked in this order. The thickness of the second Au layer 35b is set to e.g. 900 nm. The thickness of the second In layer 36b is set to e.g. 400 nm. On the other hand, on the support substrate portion 20 side, a first Au layer 35a and a first In layer 36a are stacked in this order from the side nearer to the light absorption layer 31. The thickness of the first Au layer 35a is set to e.g. 400 nm. The thickness of the first In layer 36a is set to e.g. 800 nm.

When the semiconductor active portion 10 and the support substrate portion 20 are opposed to each other, the first In layer 36a and the second In layer 36b are opposed to each other. That is, the first In layer 36a and the second In layer 36b are brought into contact with each other to bond the semiconductor active portion 10 and the support substrate portion 20.

In the following, simulation results on the manufacturing method are described according to the embodiment. The contact thermal resistance at the bonding interface is substituted by an In layer having a thickness of 20 nm. The melting point of In is 156.6° C. Assuming the case where melted In is penetrated into and alloyed with Au, this simulation is performed under the condition that the temperature of the bonding layer 33 is increased to 220° C. This condition corresponds to the case of increasing the temperature by +200 degrees at room temperature 20° C. The rest of the configuration is made identical to that of the first embodiment. The property parameters used in the simulation are as listed in TABLE 1.

Figure 14:
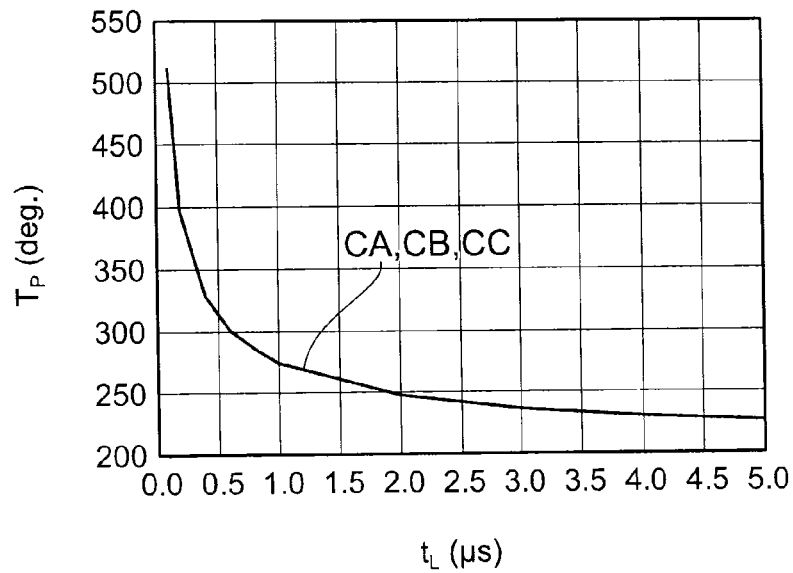
FIGS. 14 to 16B are graphs showing simulation results of the manufacturing method according to the third embodiment.

FIGS. 14 to 16B are graphs showing simulation results of the manufacturing method according to the embodiment. FIG. 14 is a graph showing the relationship between the irradiation time $t_L$ of laser light for increasing the temperature of the bonding layer 33 by 200 degrees from the temperature before heating, and the peak temperature $T_p$ of the light absorption layer 31. The horizontal axis represents the irradiation time $t_L$ of laser light. The vertical axis represents the peak temperature $T_p$.

As shown in FIG. 14, in increasing the temperature of the bonding layer 33 to the target temperature, when the irradiation time $t_L$ is short, the peak temperature $T_p$ of the light absorption layer 31 is set to a high temperature. If the irradiation time $t_L$ is long, the peak temperature $T_p$ of the light absorption layer 31 can be made low. Also in this case, there is no significant difference among the conditions CA, CB, and CC.

For instance, the peak temperature $T_p$ can be set to 500° C. or less if the irradiation time $t_L$ of laser light is 0.2 μs or more. That is, the irradiation time $t_L$ of laser light is made shorter, and the temperature increase of the support substrate 21 can be suppressed compared with the first embodiment (AuSn).

Figure 15A:
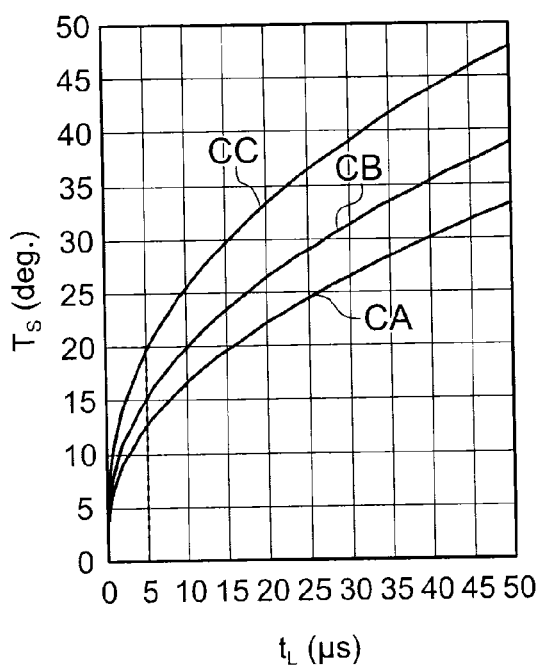
Figure 15B:
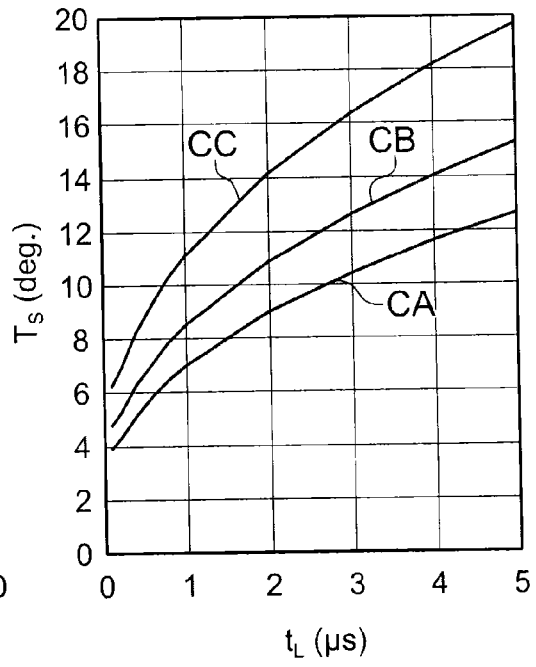

FIGS. 15A and 15B show the relationship between the steady temperature $T_S$ (the amount of temperature increase from the initial temperature) of the support substrate 21 and the irradiation time $t_L$ of laser light in the case of increasing the temperature of the bonding layer 33 by 200 degrees. FIG. 15B is a graph in which a short range of the irradiation time $t_L$ of laser light indicated by a dashed line in FIG. 15A is enlarged. The horizontal axis represents the laser irradiation time $t_L$. The vertical axis represents the steady temperature $T_S$.

The restriction on the temperature increase of the support substrate 21 is set to 40 degrees as in the first embodiment. Then, the irradiation time $t_L$ of laser light for reaching the steady temperature $T_S$ is 32 μs under the condition CC, and approximately 50 μs under the condition CB. Under the condition CA, the steady temperature $T_S$ does not reach 40 degrees within the simulated time. Thus, the time for the steady temperature $T_S$ of the support substrate 21 to reach the upper limit is made longer than in the first embodiment. That is, the irradiation time $t_L$ of laser light is relaxed relative to the first embodiment.

Figure 16A:
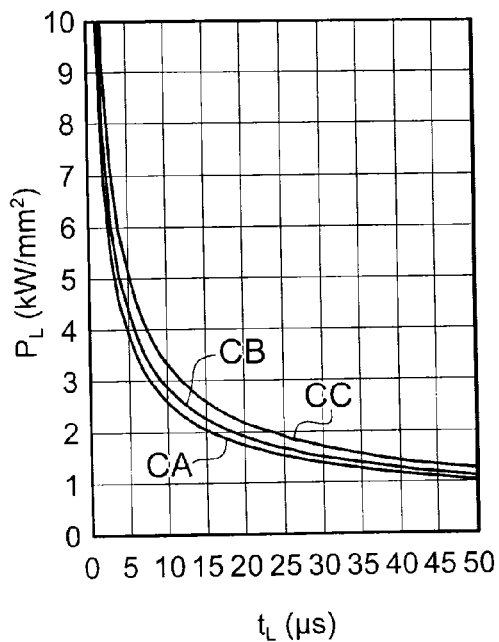
Figure 16B:
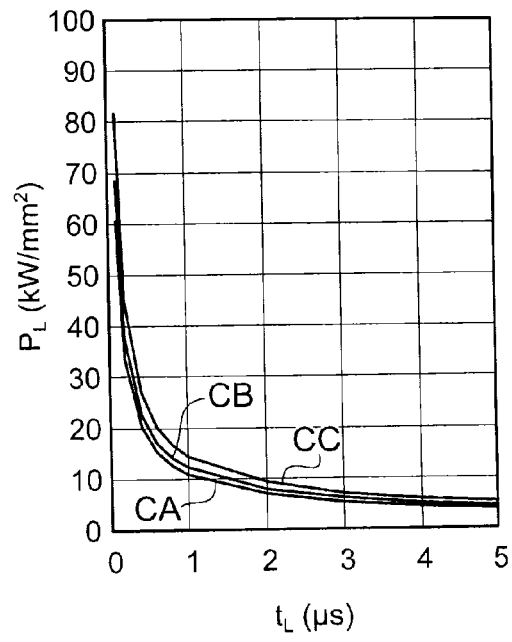

FIGS. 16A and 16B show the relationship between the energy density $P_L$ of laser light and the irradiation time $t_L$ of laser light in the case of increasing the temperature of the bonding layer 33 by 200 degrees. The horizontal axis represents the laser irradiation time $t_L$. The vertical axis represents the energy density $P_L$ of laser light. FIG. 16B shows an enlarged view of the range 0-5 μs of the irradiation time of laser light in FIG. 16A.

The energy density $P_L$ of laser light decreases as the irradiation time $t_L$ becomes longer. The energy density $P_L$ of laser light is shifted to the higher side in the order of the conditions CA, CB, and CC. However, their difference is not large. For instance, in the case where the irradiation time of laser light is 1 μs, increasing the temperature of the bonding layer 33 by 200 degrees requires an energy density of 10-15 kW/mm².

Next, the characteristics of the third embodiment are described in comparison with the first embodiment.

FIGS. 17 to 19B are graphs showing characteristics in the manufacturing method according to the first and third embodiments.

Figure 17:
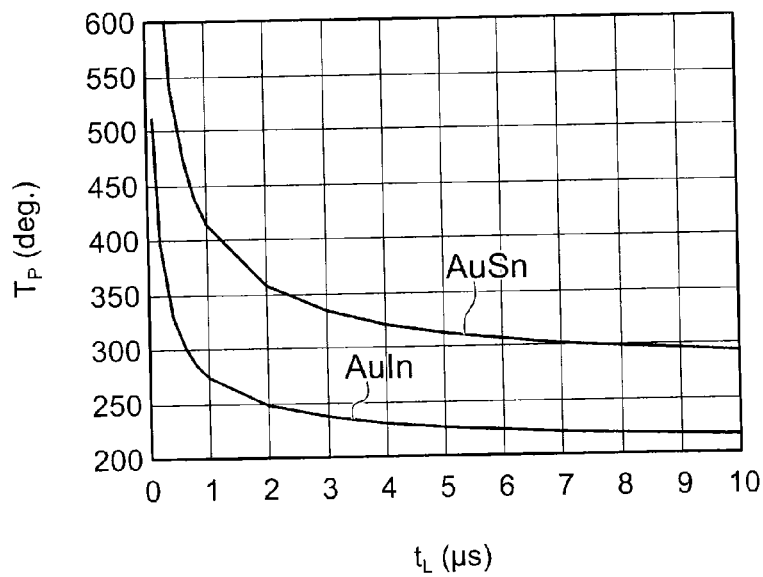
FIGS. 17 to 19B are graphs showing characteristics in the manufacturing method according to the first and third embodiments.

FIG. 17 shows the characteristics of the first embodiment and the third embodiment regarding the relationship between the irradiation time $t_L$ of laser light for setting the bonding layer 33 to a prescribed temperature and the peak temperature $T_p$ of the light absorption layer 31.

The increased temperature of the bonding layer 33 containing AuIn is lower by 60 degrees than the increased temperature of the bonding layer 33 containing AuSn. Thus, the manufacturing method according to the third embodiment can reduce the irradiation time $t_L$ of laser light.

Figure 18A:
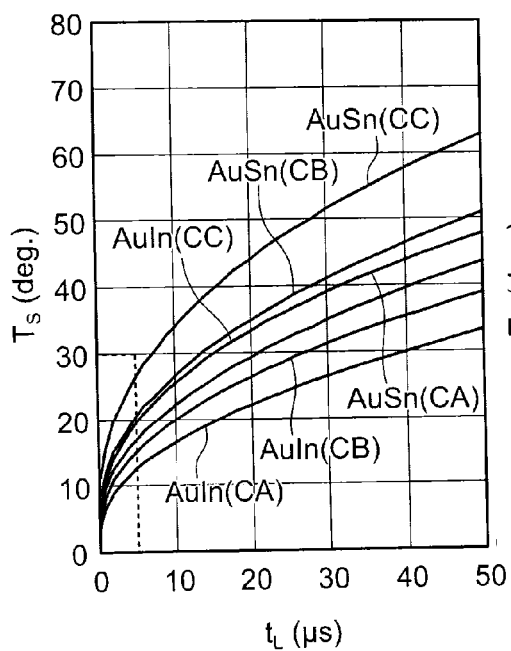
Figure 18B:
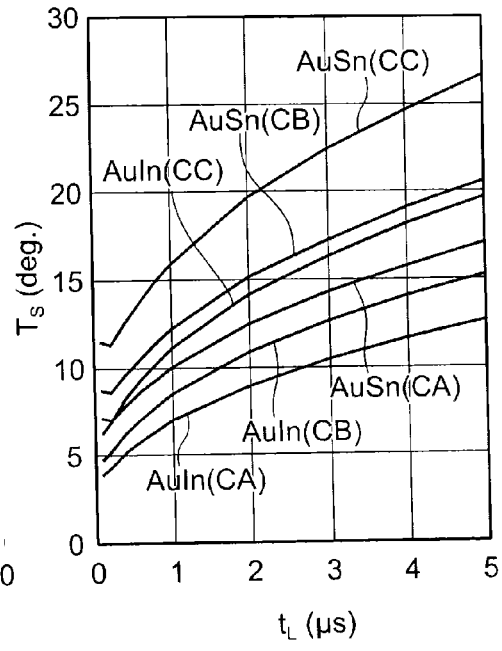

FIGS. 18A and 18B show the characteristics of the bonding layer 33 containing AuSn and the bonding layer 33 containing AuIn regarding the relationship between the steady temperature $T_S$ of the support substrate 21 and the irradiation time $t_L$ of laser light. FIG. 18B shows an enlarged view of a short range of the irradiation time indicated by a dashed line in FIG. 18A. The horizontal axis represents the laser irradiation time $t_L$. The vertical axis represents the steady temperature $T_S$.

In the third embodiment, the steady temperature $T_S$ monotonically increases with the laser irradiation time $t_L$. The temperature increase of the support substrate 21 becomes larger in the order of the conditions CA, CB, and CC. This also holds in the first embodiment (AuSn). On the other hand, by comparison under the same condition of the conditions CA, CB, and CC, the bonding layer 33 containing AuSn results in a higher steady temperature $T_S$ and a larger temperature increase of the support substrate 21 than the bonding layer 33 containing AuIn. Use of the bonding layer 33 containing AuIn can further suppress the temperature increase of the support substrate 21, and further reduce thermal damage to the semiconductor active portion 10.

Figure 19A:
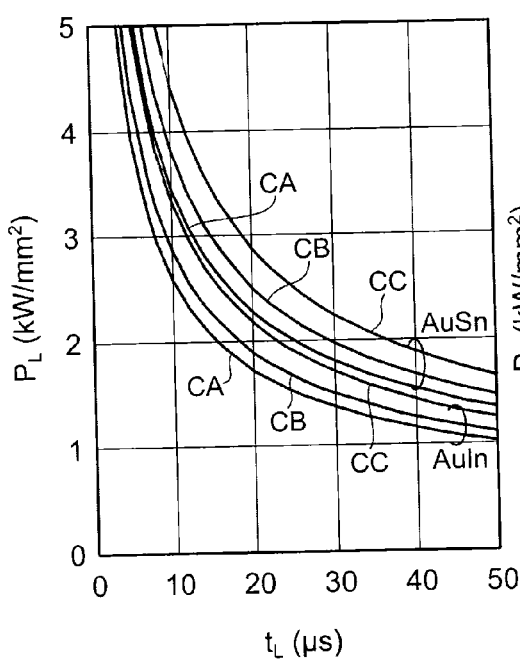
Figure 19B:
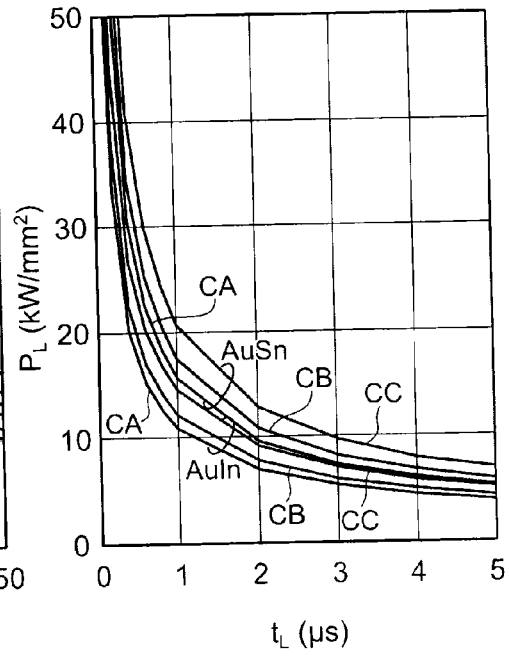

FIGS. 19A and 19B show the characteristics of the bonding layer 33 containing AuSn and the bonding layer 33 containing AuIn regarding the relationship between the energy density $P_L$ of laser light and the irradiation time $t_L$. The horizontal axis represents the laser irradiation time $t_L$. The vertical axis represents the energy density $P_L$ of laser light. FIG. 19B shows an enlarged view of the range 0-5 μs of the irradiation time $t_L$ of laser light in FIG. 19A.

In both cases of using the bonding layer 33 containing AuIn and using the bonding layer 33 containing AuSn, the energy density $P_L$ of laser light increases in the order of the conditions CA, CB, and CC. In the case of using the bonding layer 33 containing AuIn, the energy density $P_L$ of laser light can be made lower than in the case of using the bonding layer 33 containing AuSn. Thus, for instance, even in the case of using a laser with an equal output power, the spot of the laser light can be made larger in the bonding layer 33 containing AuIn. Accordingly, for instance, a larger area of the bonding layer 33 can be melted at one irradiation position.

Fourth Embodiment

Figure 20A:
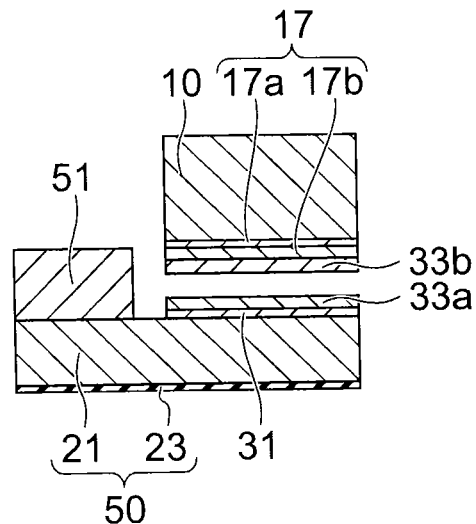
FIGS. 20A and 20B are schematic sectional views illustrating a manufacturing method of a semiconductor device according to a fourth embodiment.
Figure 20B:
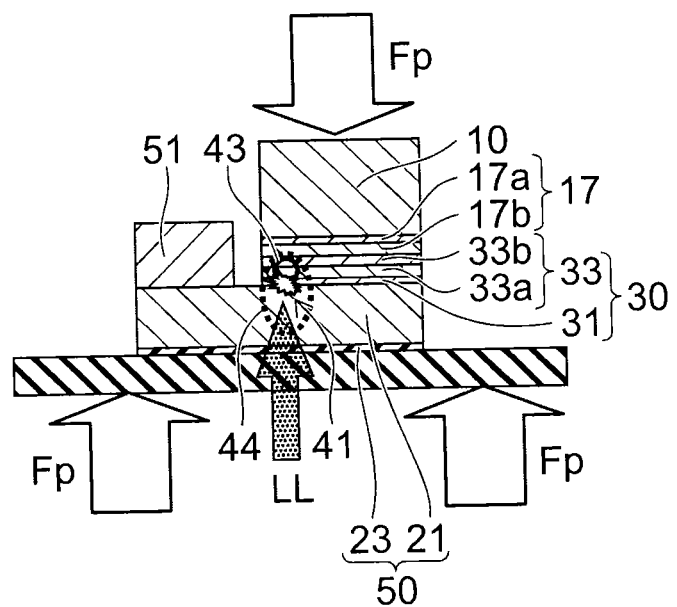

FIGS. 20A and 20B are schematic sectional views illustrating a method for manufacturing a semiconductor device according to a fourth embodiment. FIG. 20A shows the semiconductor active portion 10 and the support substrate portion 50 opposed to each other. FIG. 20B shows the first bonding film 33a and the second bonding film 33b brought into contact with each other, and the light absorption layer 31 irradiated with laser light from the support substrate portion 50 side.

In this embodiment, the semiconductor active portion 10 is selectively bonded to the support substrate portion 50. For instance, as shown in FIG. 20A, the first bonding film 33a selectively provided on the support substrate 21 in the support substrate portion 50 and the second bonding film 33b provided in the semiconductor active portion 10 are opposed to each other. Between the support substrate 21 and the first bonding film 33a, a light absorption layer 31 is selectively provided.

Next, as shown in FIG. 20B, with the first bonding film 33a and the second bonding film 33b brought into contact with each other, the semiconductor active portion 10 and the support substrate portion 50 are brought into tight contact with each other under a pressure FP. Then, laser light is selectively applied through the support substrate portion 50. Thus, the light absorption layer 31 is heated to melt the bonding layer 33. Accordingly, the semiconductor active portion 10 is bonded to the support substrate portion 50.

In the example shown in FIGS. 20A and 20B, the semiconductor active portion 10 is e.g. a semiconductor chip bonded to the support substrate portion 50. The support substrate portion 50 may be provided with an element 51 having a function different from that of the semiconductor active portion 10.

For instance, the element 51 is an electronic device for controlling the semiconductor active portion 10, and the semiconductor active portion 10 is a semiconductor light emitting element. Thus, a light emitting device including a semiconductor light emitting element integrated with its controller can be formed.

Figure 21A:
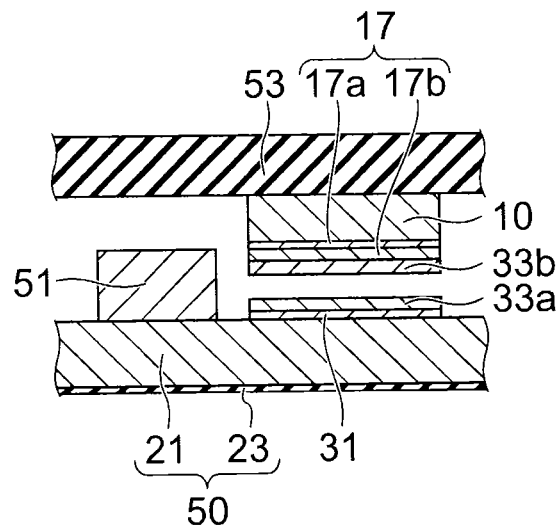
FIGS. 21A and 21B are schematic sectional views showing a manufacturing method of a semiconductor device according to a variation of the fourth embodiment.
Figure 21B:
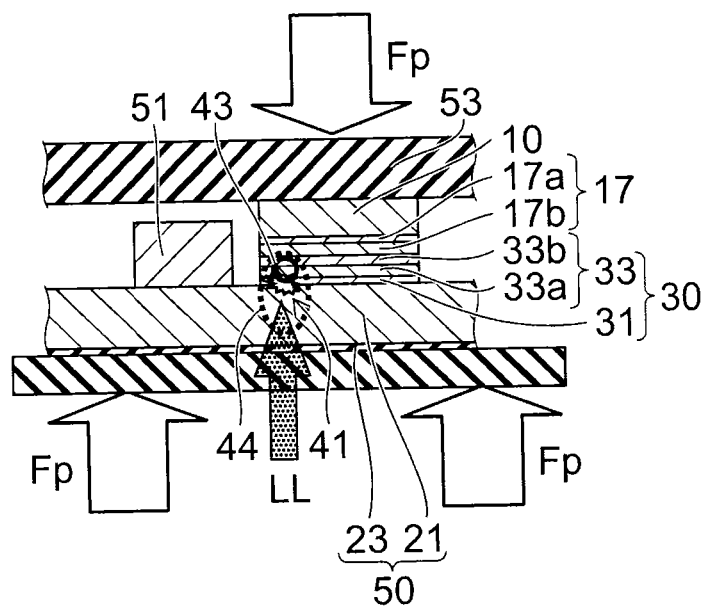

FIGS. 21A and 21B are schematic sectional views showing a method for manufacturing a semiconductor device according to a variation of the fourth embodiment. FIG. 21A shows the semiconductor active portion 10 and the support substrate portion 50 opposed to each other. FIG. 21B shows the first bonding film 33a and the second bonding film 33b brought into contact with each other, and the light absorption layer 31 irradiated with laser light from the support substrate portion 50 side.

In this example, the semiconductor active portion 10 is provided on part of a substrate 53.

As shown in FIG. 21A, the substrate 53 including a plurality of semiconductor active portions 10 and the support substrate portion 50 are opposed to each other.

Next, the first bonding film 33a and the second bonding film 33b are brought into contact with each other. Laser light is applied through the support substrate portion 50 to bond the semiconductor active portion 10 and the support substrate portion 50.

Furthermore, laser light is applied from the rear surface side of the substrate 53 to melt the interface between the substrate 53 and the semiconductor active portion 10. Thus, the substrate 53 is separated from the semiconductor active portion 10.

Thus, an integrated device with the semiconductor active portion 10 and the element section 51 placed on the support substrate portion 50 can be formed. As described above, the semiconductor active portion 10 can be a semiconductor light emitting element, and the element 51 can be its controller. Alternatively, another functional element may be combined.

According to the above first to fourth embodiments, the support substrate portion 20 and the semiconductor active portion 10 can be bonded to each other while suppressing the temperature increase of the support substrate portion 20 by rapid laser irradiation. The support substrate 21 used has a higher thermal conductivity than the bonding portion 30 irradiated with laser light. This suppresses the temperature increase of the support substrate 21. For instance, the semiconductor active portion 10 and the support substrate portion 20 can be bonded to each other at a temperature comparable to that of the bonding method using e.g. resin. This can suppress thermal damage to the semiconductor active portion 10. Furthermore, use of the metal bonding portion 30 can ensure electrical conduction between the support substrate portion 20 and the semiconductor active portion 10. This can easily realize a vertical device in which a current is passed between the front surface and the back surface of the chip.

In the manufacturing method according to the embodiments, the portion irradiated with laser light is selectively and locally heated. This suppresses stress and wafer warpage due to the difference in thermal expansion coefficient between the semiconductor active portion 10 and the support substrate portion 20. Thus, for instance, fracture and crush of the wafer can be suppressed. Accordingly, the manufacturing yield can be improved.

The warpage and stress of the wafer increase with the increase of the bonding area. This limits the size of the semiconductor active portion 10. Furthermore, the heat at the time of bonding may cause degradation of the metal portion such as electrodes provided in the semiconductor active portion 10, and diffusion in the layers. The manufacturing method according to the embodiments avoids these problems and improves the manufacturing efficiency, and can also contribute to improving the quality of products.

The embodiments provide a semiconductor device and a method for manufacturing the same suppressing damage to the semiconductor layer in bonding the semiconductor layer and the support substrate.

In this description, the "nitride semiconductor" includes group III-V compound semiconductors of $B_x In_y Al_z Ga_{1-x-y-z}N$ ($0 \le x \le 1$, $0 \le y \le 1$, $0 \le z \le 1$, $0 \le x+y+z \le 1$). Furthermore, the "nitride semiconductor" includes mixed crystals containing e.g. phosphorus (P) or arsenic (As) in addition to N (nitrogen) as group V elements. Furthermore, the "nitride semiconductor" also includes those further containing various elements added for controlling various material properties such as conductivity type, and those further containing various unintended elements.

The embodiments of the invention have been described above with reference to examples. However, the invention is not limited to these examples. For instance, any specific configurations of various components of the semiconductor active portion, the support substrate portion, and the bonding portion used in the method for manufacturing a semiconductor device are encompassed within the scope of the invention as long as those skilled in the art can similarly practice the invention and achieve similar effects by suitably selecting such configurations from conventionally known ones.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, the method comprising:
   facing a semiconductor active portion toward a support substrate portion via a bonding portion disposed between the semiconductor active portion and the support substrate portion, the bonding portion including a bonding layer and a light absorption layer, absorptance of the light absorption layer for laser light being higher than or equal to absorptance of the bonding layer for the laser light; and
   bonding the semiconductor active portion and the support substrate portion by irradiating the light absorption layer with the laser light through the support substrate portion and melting the bonding layer by thermal conduction from the light absorption layer heated by the laser light,
   wherein the bonding layer contains at least one selected from Au, Ag, In, Sn, Zn, Pb, Ga, Bi, and Cd.

2. The method according to claim 1, wherein reflectance of the light absorption layer for the laser light is 60 percent or less, and the bonding layer has a melting point of 100 degrees Celsius or more and 300 degrees Celsius or less.

3. The method according to claim 1, wherein the support substrate portion has a higher thermal conductivity than the bonding portion.

4. The method according to claim 1, wherein irradiation time of the laser light at one irradiation position of the light absorption layer is 40 microseconds or less.

5. The method according to claim 1, wherein penetration length of the laser light in the light absorption layer is 1 micrometer or less.

6. The method according to claim 1, wherein the light absorption layer contains at least one selected from Cr, Ti, W, Ni, V, Mn, Fe, Co, Ge, C, and Si.

7. The method according to claim 1, wherein the support substrate portion contains one of Si, SiC, diamond, GaN, AlGaN, AlN, and BN.

8. The method according to claim 1, wherein the support substrate portion includes a Si substrate, and the light absorption layer contains at least one selected from Cr, Ti, and C.

9. The method according to claim 1, wherein the support substrate portion includes an AlN substrate, and the light absorption layer contains at least one selected from Cr, Ti, C, Si, and Ge.

10. The method according to claim 1, wherein the support substrate portion includes an SiC substrate, and the light absorption layer contains at least one selected from Cr, Ti, C, Si, and Ge.

11. The method according to claim 1, wherein the support substrate portion includes an GaN substrate, and the light absorption layer contains at least one selected from Cr, Ti, C, Si, and Ge.

12. The method according to claim 1, wherein the support substrate portion includes an BN substrate, and the light absorption layer contains at least one selected from Cr, Ti, C, Si, and Ge.

13. The method according to claim 1, wherein the light absorption layer has a thickness of 10 nanometers or more and 200 nanometers or less, and the bonding layer has a thickness of 1 micrometer or more.

* * * * *